United States Patent [19]
Nakajima et al.

[11] Patent Number: 5,306,388
[45] Date of Patent: Apr. 26, 1994

[54] QUARTZ GLASS CRUCIBLE FOR PULLING A SEMICONDUCTOR SINGLE CRYSTAL

[75] Inventors: Toshio Nakajima; Tohru Ito; Yoshinobu Nagamine, all of Oguni, Japan

[73] Assignee: Toshiba Ceramics Co., Ltd., Tokyo, Japan

[21] Appl. No.: 828,503

[22] Filed: Jan. 31, 1992

[51] Int. Cl.$^5$ .................................... B01D 9/00
[52] U.S. Cl. ................... 156/620.4; 156/617.1; 156/DIG. 83; 422/248
[58] Field of Search ............ 156/617.1, 618.1, 620.4, 156/DIG. 83; 422/248

[56] References Cited
U.S. PATENT DOCUMENTS

| | | | |
|---|---|---|---|
| 4,416,680 | 11/1983 | Bruening et al. | 65/144 |
| 4,528,163 | 7/1985 | Albrecht | 422/249 |
| 4,632,686 | 12/1986 | Brown et al. | 65/18.1 |
| 4,935,046 | 6/1990 | Uchikawa et al. | 264/101 |
| 4,956,208 | 9/1990 | Uchikawa et al. | 428/34.6 |

*Primary Examiner*—Olik Chaudhuri
*Assistant Examiner*—Felisa Garrett
*Attorney, Agent, or Firm*—Foley & Lardner

[57] ABSTRACT

A quartz glass crucible for pulling a single crystal, which comprises a cylindrical straight wall portion, a bottom wall portion and a curved intermediate wall portion connecting the straight portion and the bottom portion. The straight portion has an opaque area positioned within about 75% or less of the total height of the crucible, measured from the upper open end of the crucible. The opaque area in the straight portion has a total bubble volume which ranges from about $7 \times 10^{-3}$ cm$^3$/cm$^3$ to $30 \times 10^{-3}$ cm$^3$/cm$^3$. The remaining straight portion, the curved intermediate portion and the bottom portion consist of transparent material having a total volume of bubbles of about $4 \times 10^{-3}$ cm$^3$/cm$^3$ or less.

9 Claims, 2 Drawing Sheets

QUARTZ GLASS CRUCIBLE FOR PULLING A SEMICONDUCTOR SINGLE CRYSTAL

BACKGROUND OF THE INVENTION

1. Field of the Invention

This invention relates to a quartz glass crucible for pulling a semiconductor single crystal, such as silicon single crystal.

More specifically, the present invention relates to a quartz glass crucible having two portions, i.e., an opaque portion and a transparent portion, in its structure, which can decrease defects in pulled silicon single crystals. In the single crystal pulling process, such crucibles are used as a container for melted semiconductor materials.

2. Description of Related Art

Conventionally, in producing a single crystal such as a single crystal, silicon semiconductor material, the so-called "Czochralski" method has been widely adopted. According to that method, polycrystalline silicon is melted in a vessel, and a seed crystal is dipped at its tip end portion into the melt. Then the seed is pulled while it is being rotated so that a single crystal is grown on the seed with the same crystallographic orientation. A vessel adapted for the pulling of a single crystal is made in the form of a quartz crucible. Quartz crucibles are classified in accordance with their external appearance, which is determined by the differences in the production methods. There are two basic categories, namely, transparent crucibles having a relatively low bubble content, and opaque crucibles having a high content of minute bubbles to provide an opaque appearance. The latter crucible will hereinafter be referred to as the "opaque crucible".

The opaque crucible is produced by a process in which powders of quartz are introduced into a mold and accumulated to form a layer along the inner surface of the mold. The layer of quartz powder is then heated at the inner surface thereof while the mold is rotated, to produce a crucible of a glass having a relatively high bubble content. The opaque quartz crucible is advantageous in that it has a higher strength when compared with a transparent crucible, and it is relatively easy to form a crucible of a large size. Further, minute bubbles contained in the opaque crucible contribute to uniformize the thermal distribution. For the reasons stated above, the opaque crucible has been widely used in practice.

In the above-described conventional quartz glass crucible, which consists of a totally opaque body, the bubbles in the crucible body increase in volume during the step of pulling the single crystal under a reduced pressure at a high temperature. Consequently, the specific gravity of the crucible changes, and the crucible is deformed so as to change the liquid level of the melt in the crucible. Sometimes, the bubbles in the crucible body are ruptured, with the result that the glass layer of the crucible positioned above the liquid level peels and the peeled particles fall into the melt in the crucible. As a result, the contact area between the crucible and the melt is increased, causing the concentration of dissolved oxygen to increase. Accordingly, the pull yield is decreased, and then the quality of the semiconductor wafers is decreased.

U.S. Pat. No. 4,956,208 teaches the formation of a substantially bubble-free inner layer on an outer substrate layer, by forming an atmosphere of high temperature gas and supplying a metered quantity of quartz powders to the high temperature gas atmosphere. It is intended to have the quartz powders be at least partly molten and directed toward an inner surface of the substrate layer so as to be adhered thereon.

U.S. Pat. No. 4,528,163 teaches the formation of a crucible substrate with an outer layer made of powders of natural quartz and an inner layer made of powders of synthetic quartz. The crucible substrate is then heated at the inner surface to form a thin smooth layer of an amorphous nature. In the specification of the '163 patent, the inner layer comprises synthetic "crystalline" quartz. The inner layer formed in accordance with the teaching of this patent should be considered to contain a noticeable quantity of bubbles or voids.

U.S. Pat. No. 4,416,680 and U.S. Pat. No. 4,632,686 teach the idea of decreasing the bubble content by applying a suction pressure to the external surface of the quartz crucible while the crucible is being heated. However, the processes taught by these patents are not particularly effective to decrease the bubble content because the bubbles are subjected to a substantial resistance in passing through the layer of quartz glass.

In the practice of pulling silicon single crystals, the quality control of the pulled single crystal, even during pulling, is significant. It is said that some microdefects, such as so-called oxidation stacking fault (OSF) or bulk micro defect (BMD), are mostly due to the thermal history of the single crystal in a high temperature area near the crucible after it was crystallized. The pulling of silicon single crystals is carried out usually with the apparatus shown in FIG. 1. With reference to FIG. 1, some upper portion of quartz crucible 21 is positioned above the carbon holder 22, in order to make it easy to handle the quartz crucible. In such a construction, if there is a transparent layer 25 which tends to transfer heat easily, the heat coming from the heater 23 which surrounds the crucible will become more than that of an opaque crucible, and the heat from the melt contained in the crucible will transfer via the transparent layer 25 and will emit from the top end of the crucible. The just-crystallized silicon crystal 27 which is being pulled receives such undesirable heat emissions. Additionally, since the heat escapes from the melt through the transparent layer to the top end of the layer, which terminates freely, control of the melt temperature becomes difficult. As a result of these problems, the OSF and BMD are increased, and the yield of good single crystal is decreased.

Therefore, there is a need for providing a quartz crucible which can overcome such problems.

SUMMARY OF THE INVENTION

It is an object of the present invention to provide a quartz glass crucible for pulling a single crystal in which the yield of single crystal production can be increased.

It is another object of the invention to provide a method of pulling a silicon single crystal with such a quartz glass crucible.

It is another object of the invention to provide an apparatus for pulling a silicon single crystal with such a crucible.

In accomplishing the objects of the present invention there has been provided according to one aspect of the invention, a quartz glass crucible for pulling a semiconductor single crystal comprising a cylindrical straight portion, a bottom portion and a curved intermediate portion for connecting the straight portion with the bottom portion. The straight portion includes a totally opaque area having a width or length corresponding to 75% or less of the total height of the crucible from an upper open end of the crucible. The opaque area has many bubbles in the straight portion, the total volume of which ranges from about $7 \times 10^{-3}$ cm$^3$/cm$^3$ to $30 \times 10^{-3}$ cm$^3$/cm$^3$. The remaining area of the straight portion, the curved intermediate portion and the bottom portion comprise a transparent layer having a total volume of bubbles of $4 \times 10^{-3}$ cm$^3$/cm$^3$ or less.

According to another aspect of the present invention there has been provided a method and apparatus for pulling a semiconductor single crystal using the crucible according to the invention.

Further objects, features and advantages of the present invention will become apparent from the detailed description of preferred embodiments that follows, when considered together with the attached figures of drawing.

BRIEF DESCRIPTION OF THE DRAWINGS

This invention is described with reference to the following detailed description taken in conjunction with the drawings in which.

DETAILED DESCRIPTION OF THE PREFERRED EMBODIMENTS

Preferred embodiments of this invention will be described with reference to the drawings.

Figure 1:
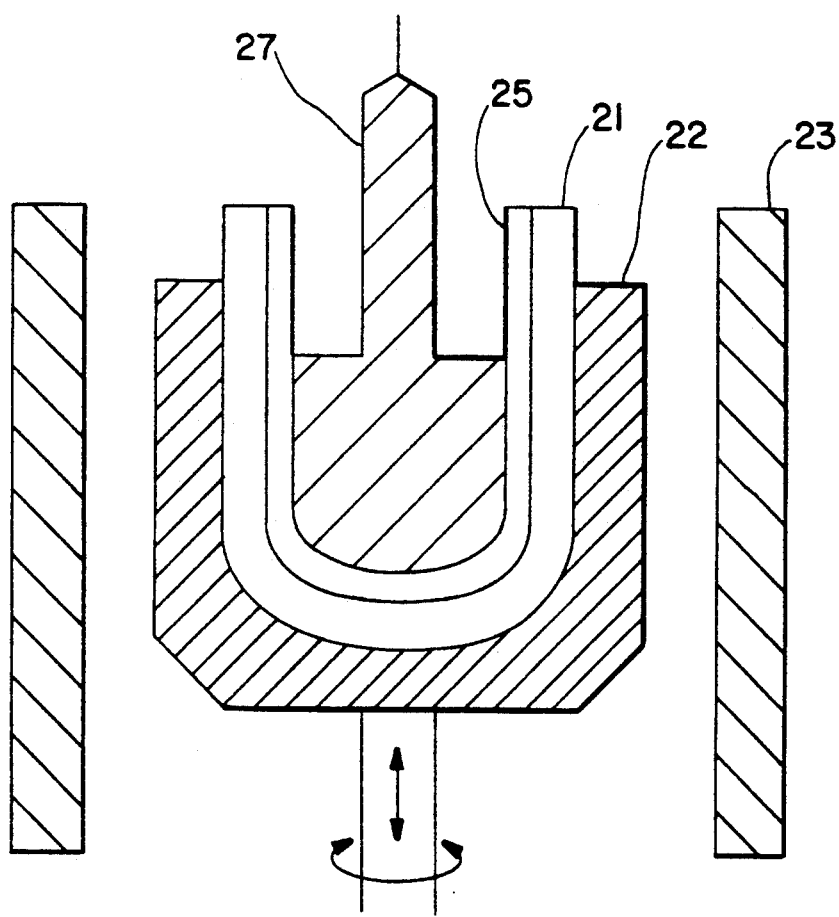
FIG. 1 is a vertical sectional view showing a part of a conventional single crystal pulling apparatus.
Figure 2:
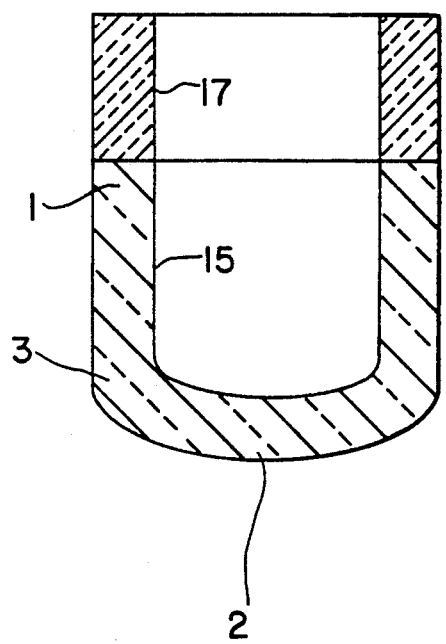
FIG. 2 is a vertical sectional view showing a quartz glass crucible for pulling a single crystal according to one embodiment of the present invention.

With reference to FIG. 2, the crucible has a cylindrical straight portion 11, a bottom portion 12 slightly projecting in a lower direction with a relatively large curvature, and a curved intermediate portion 13 for connecting the straight portion 11 and the bottom portion 12.

The portion 15 of the crucible which directly contacts the melt therein, such as silicon, is transparent because it includes only a small number of bubbles. The portion 17 of the crucible which faces a single crystal ingot as it is being drawn is opaque because it includes many bubbles. The totally opaque area of the straight portion of the crucible preferably extends within 75% or less of the total height of the crucible, measured from the open end.

If the total volume of bubbles in the above-described opaque area is more than about $30 \times 10^{-3}$ cm$^3$/cm$^3$, the portion of the wall near the open end of the crucible is largely deformed during the single crystal pulling step, so that the pulling operation cannot be smoothly carried out. On the other hand, if the total volume of the bubbles in the totally opaque straight portion area is less than about $7 \times 10^{-3}$ cm$^3$/cm$^3$, the radiant heat coming directly from the carbon heater cannot be cut-off or shielded, and it will affect the single crystal ingot during the pulling step. As a consequence, temperature control becomes difficult, and the pulling operation cannot be properly carried out.

If the length of the totally opaque area of the straight portion having a total volume of bubbles of from about $7 \times 10^{-3}$ cm$^3$/cm$^3$ to $30 \times 10^{-3}$ cm$^3$/cm$^3$ is more than 75% of the total height of the crucible, the contact area between the totally opaque area and the melt (such as silicon) in the crucible increases so as to increase the bubble effects. It is preferable that the lower limit of the totally opaque area is positioned above the initial melt level or surface and is arranged over a height corresponding to about 30-50% of the total height of the crucible, measured from the upper open end thereof.

If the total volume of bubbles in the remaining area 15 of the straight portion, the curved intermediate portion and the bottom portion is more than about $4 \times 10^{-3}$ cm$^3$/cm$^3$, the bubble expansion, the melt level change due to the bubble rupture, the falling of the glass layer or the devitrification layer into the melt all result in an increase in the dissolved oxygen concentration, so that the pull yield and the quality of semiconductor wafers decrease. In particular, it is preferable that the area 15 on the straight portion, the curved portion and the bottom portion have a total bubble volume of about $1 \times 10^{-3}$ cm$^3$/cm$^3$ or less.

EMBODIMENT 1

Quartz crystal powder having a grain size of from 30-50 mesh (#) to 50 was arranged in a carbon mold, on a previously deposited (in the lower part of the mold) mixture of quartz crystal powder having a grain size of 200 mesh or less and powder having a grain size of from 80 mesh to 150 mesh in the ratio of 2:5 in a uniform and homogeneous mixed condition. The mold is a suitable conventional device in the shape of a crucible. Each particle of the powder contained only a small volume of bubbles. Such quartz crystal powder was fused by a conventional arc means, with the same heating conditions being applied to the entire contents of the mold. Thereby, as shown in FIG. 2, a crucible of 14 inch type having a height of 254 mm was produced. The arc operation was continued long enough to form a thick transparent layer in the lower part of the formed crucible. The carbon mold is rotated through the beginning of arranging the quartz crystal powder to the end of the arc operation. The crucible has a cylindrical straight wall portion 11, a bottom wall portion 12 slightly projecting in a lower direction with a relatively large curvature and a curved intermediate wall portion 13 for connecting the straight wall portion 11 and the bottom wall portion 12.

In this crucible, the area of the straight portion 11 having a height of 80 mm from its upper open end had a total bubble volume of from $7 \times 10^{-3}$ cm$^3$/cm$^3$ to $30 \times 10^{-3}$ cm$^3$/cm$^3$. The remaining area of the straight wall portion 11, the curved intermediate wall portion 13 and the bottom wall portion 12 consisted essentially of a transparent quartz glass.

The transparent portion was integrally joined to the opaque portion. The former can be formed in place of the latter by an electric arc operation after the whole of the crucible is opaque. Alternatively, the opaque upper portion can be integrally adhered to the upper transparent area of the straight wall portion 11 after they are separately produced.

The above-described crucible was used in an actual silicon single crystal pulling process. The crucible was settled on the holder made of carbon with close contact to prevent the deformation of the crucible. The holder with crucible was set at the predetermined position in the chamber of a single crystal pulling apparatus. A cyrindrical carbon heater was provided surrounding the holder. After the crucible was filled with 30 kg of porous-crystalline silicon, the chamber was made air tight.

Two silicon single crystals were pulled in sequence. The pulling process was carried out 50 times with the above-described crucible, i.e., 100 silicon single crystals were pulled.

The average pull yield for two crystals was increased by 3% when the above-stated crucible is used in order to pull a semiconductor silicon single crystal, in comparison with a conventional 2 layer crucible of 14 inch type in which the entire inner surface of the crucible has a transparent layer and the outer portion was opaque. The results are shown in Table 1.

EMBODIMENT 2

By the same method as used in Embodiment 1, a crucible of 14 inch type having a total height of 254 mm was produced.

In this crucible, the area of the straight opaque portion has a height of 100 mm from its upper open end and a total bubble volume of from $7 \times 10^{-3}$ cm$^3$/cm$^3$ to $30 \times 10^{-3}$ cm$^3$/cm$^3$.

The remaining area of the straight portion, the curved intermediate portion and the bottom portion consisted essentially of a transparent layer. Like in Embodiment 1, an upper portion of the straight portion having a height of 100 mm from its upper open end was opaque. The other portion of the crucible was transparent.

The above-described crucible was used in an actual silicon single crystal pulling process. The crucible was settled on the holder made of carbon with close contact to prevent the deformation of the crucible. The holder with crucible was set at the predetermined position in the chamber of a single crystal pulling apparatus. A cyrindrical carbon heater was provided surrounding the holder. After the crucible was filled with 30 kg of porous-crystalline silicon, the chamber was made air tight. Two silicon single crystals were pulled in sequence. The pulling process was carried out 50 times with the above-described crucible, i.e., 100 silicon single crystals were pulled.

The average pull yield for two crystals was increased by 3% when the above-stated crucible was used in order to pull a semiconductor silicon single crystal, in comparison with a conventional 2 layer crucible of 14 inch type in which the entire inner surface of the crucible has a transparent layer and the outer portion was opaque. The results are shown in Table 1.

TABLE 1

| Order of Crystal | Average Pull Yield of 100 crystals (%) | | |
|---|---|---|---|
| | Prior Art | Embodiment 1 | Embodiment 2 |
| First | 90 | 89 | 90 |
| Second | 78 | 85 | 88 |
| Average | 84 | 87 | 89 |

According to the present invention, a straight portion of the crucible, which has a predetermined height from its upper open end and faces a semiconductor single crystal ingot, is opaque because it includes many bubbles therein. The other portion of the crucible which contacts directly the semiconductor melt, such as silicon in the crucible, is transparent because the number of bubbles is small. The opaque portion shields the radiation of heat from the heater and prevents heat radiation from the open upper end of the crucible, due to the heat transfered by infrared rays which can go through the transparent portion.

Therefore, the disadvantageous effects of the bubbles placed in the crucible body can be eliminated, whereas the meritorious effects of the bubbles in the crucible body can be properly utilized. As a result, the yield of pulling a single crystal can be improved in comparison with the prior art single crystal pull yield. In addition, semiconductor devices can be produced from such a single crystal at a high production yield, and the production reliability can be improved.

The foregoing description has been set forth merely to illustrate the invention and is not intended to be limiting. Since modifications of the described embodiments incorporating the spirit and substance of the invention may occur to persons skilled in the art, the scope of the invention should be construed as including all variations falling within the appended claims and equivalents.

What is claimed is:

1. A quartz glass crucible for pulling a semiconductor single crystal, which comprises:
   a cylindrical straight wall portion comprising a first area and a second area, said first area having a height corresponding to about 75% or less of the total height of the crucible measured from an upper open end of the crucible, the first area comprising across its entire thickness an opaque material having a volume of bubbles ranging from about $7 \times 10^{-3}$ cm$^3$/cm$^3$ to $30 \times 10^{-3}$ cm$^3$/cm$^3$;
   a bottom wall portion; and
   a curved intermediate wall portion connecting the straight wall portion and the bottom-wall portion;
   the second area of the straight wall portion, the bottom wall portion and the curved intermediate wall portion consist essentially of transparent quartz glass having a total volume of bubbles of about $4 \times 10^{-3}$ cm$^3$/cm$^3$ or less.

2. A quartz glass crucible for pulling a semiconductor single crystal as defined in claim 1, in which the first area of the straight wall portion is integral with the second area of the straight wall portion.

3. A quartz glass crucible for pulling a semiconductor single crystal as defined claim 1, in which the second area of the straight wall portion, the bottom wall portion and the curved intermediate wall portion consist essentially of transparent quartz glass having a total volume of bubbles of about $1 \times 10^{-3}$ cm$^3$/cm$^3$ or less.

4. A quartz glass crucible for pulling a semiconductor single crystal as defined in claim 1, in which the straight wall portion further comprises a third area disposed between the first area and the second area, the third area having a total volume of bubbles greater than the total volume of bubbles of the second area and smaller than the total volume of bubbles of the first area.

5. An apparatus for pulling silicon single crystal comprising:
   a quartz glass crucible comprising:
      a cylindrical straight wall portion comprising a first area and a second area, said first area having a height corresponding to about 75% or less of the total height of the crucible measured from an upper open end of the crucible, the first area comprising across its entire thickness an opaque material having a volume of bubbles ranging from about $7 \times 10^{-3}$ cm$^3$/cm$^3$ to $30 \times 10^{-3}$ cm$^3$/cm$^3$;
      a bottom wall portion; and
      a curved intermediate wall portion connecting the straight wall portion and the bottom wall portion;

the second area of the straight wall portion, the bottom wall portion and the curved intermediate wall portion consist essentially of transparent quartz glass having a total volume of bubbles of about $4 \times 10^{-3}$ cm$^3$/cm$^3$ or less;

a holder contacting the quartz glass crucible for holding the crucible;

a heater surrounding the quartz glass crucible and the holder; and a chamber in which the quartz glass crucible is provided, the chamber being able to provide an airtight internal space.

6. An apparatus as defined in claim 5, in which said second area of the straight portion is integral with the first area of the straight portion.

7. An apparatus as defined in claim 5, in which the second area of the straight wall portion, the bottom wall portion and the curved intermediate wall portion consist essentially of transparent quartz glass having a total volume of bubbles of about $1 \times 10^{-3}$ cm$^3$/cm$^3$ or less.

8. An apparatus as defined in claim 5, in which the straight wall portion further comprises a third area disposed between the first area and the second area, the third area having a total volume of bubbles greater than the total volume of bubbles of the second area and smaller than the total volume of bubbles of the first area.

9. A method of pulling a silicon single crystal comprising the steps of:

supplying metallic silicon into a quartz crucible comprising:

a cylindrical straight wall portion comprising a first area and a second are, said first area having a height corresponding to about 75% or less of the total height of the crucible measured from an upper open end of the crucible, the first area comprising across its entire thickness an opaque material having a volume of bubbles ranging from about $7 \times 10^{-3}$ cm$^3$/cm$^3$ to $30 \times 10^{-3}$ cm$^3$/cm$^3$;

a bottom wall portion; and a curved intermediate wall portion connecting the straight wall portion and the bottom wall portion;

the second area of the straight wall portion, the bottom wall portion and the curved intermediate wall portion consist essentially of transparent quartz glass having a total volume of bubbles of about $4 \times 10^{-3}$ cm$^3$/cm$^3$ or less;

melting the metallic silicon by heating; and pulling a silicon single crystal from the melted metallic silicon.

* * * * *